(12) United States Patent
Komatsu et al.

(10) Patent No.: US 12,412,788 B2
(45) Date of Patent: Sep. 9, 2025

(54) PROCESSING METHOD

(71) Applicant: DISCO CORPORATION, Tokyo (JP)

(72) Inventors: Atsushi Komatsu, Tokyo (JP); Koichi Makino, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 149 days.

(21) Appl. No.: 18/413,289

(22) Filed: Jan. 16, 2024

(65) Prior Publication Data

US 2024/0258179 A1 Aug. 1, 2024

(30) Foreign Application Priority Data

Jan. 27, 2023 (JP) ................................. 2023-010842

(51) Int. Cl.

| | | |
|---|---|---|
| *H01L 21/66* | (2006.01) | |
| *B23K 31/10* | (2006.01) | |
| *H01L 21/02* | (2006.01) | |
| *H01L 21/304* | (2006.01) | |
| *B23K 101/40* | (2006.01) | |

(52) U.S. Cl.
CPC .............. *H01L 22/12* (2013.01); *B23K 31/10* (2013.01); *H01L 21/0201* (2013.01); *H01L 21/304* (2013.01); *B23K 2101/40* (2018.08)

(58) Field of Classification Search
CPC ... H01L 22/12; H01L 21/0201; H01L 21/304; B23K 31/10
See application file for complete search history.

(56) References Cited

U.S. PATENT DOCUMENTS

| | | | |
|---|---|---|---|
| 2022/0274222 A1* | 9/2022 | Wakabayashi | .......... B24B 49/03 |
| 2023/0187286 A1* | 6/2023 | Oga | ........................... G03F 7/20 |
| | | | 438/14 |
| 2023/0213331 A1* | 7/2023 | Nomaru | ................. G01B 11/03 |
| | | | 356/503 |
| 2023/0369086 A1* | 11/2023 | Ohtsu | ...................... H01L 22/20 |
| 2024/0068964 A1* | 2/2024 | Gov | ........................ G01N 23/20 |
| 2025/0003898 A1* | 1/2025 | Sun | ........................ G01B 15/02 |

FOREIGN PATENT DOCUMENTS

| | | |
|---|---|---|
| JP | 2000087282 A | 3/2000 |
| JP | 2000216227 A | 8/2000 |

* cited by examiner

*Primary Examiner* — Omar Flores Sanchez
(74) *Attorney, Agent, or Firm* — GREER BURNS & CRAIN, LTD.

(57) ABSTRACT

A cutting method that measures heights of an outer periphery of a wafer, calculates height distribution data, and then calculates change rates of the heights of the outer periphery of the wafer. Based on results of a comparison between the height change rates and a threshold, the cutting method determines whether or not foreign matter exists on a back surface of the wafer (i.e., whether or not foreign matter exists on a holding surface of a chuck table). The existence of foreign matter on the holding surface can hence be detected appropriately. If foreign matter exists on the holding surface, a worker is notified, and the cutting operation is cancelled. Therefore, the cutting method can appropriately give notification to the worker that foreign matter is stuck on the holding surface, and can also appropriately avoid performing cutting processing with foreign matter stuck on the holding surface.

2 Claims, 5 Drawing Sheets

PROCESSING METHOD

BACKGROUND OF THE INVENTION

Field of the Invention

The present invention relates to a cutting apparatus and a cutting method.

Description of the Related Art

A silicon wafer with a plurality of devices such as integrated circuits (ICs) or large scale integration (LSI) formed on a front surface thereof is ground at a back surface thereof to be formed to have a predetermined thickness, and is then divided into individual device chips by a cutting apparatus. The divided device chips are used in electronic equipment such as mobile phones and personal computers.

When dividing a workpiece such as the above-described silicon wafer into individual device chips, a cutting apparatus that includes a chuck table, which has a holding surface that holds the workpiece by suction, and a cutting blade is used in general (see, for example, JP 2000-087282A). The cutting blade is, for example, a hub blade having a hub and a blade electrodeposited on the hub by a Ni plating process.

On the cutting apparatus, cutting processing for the workpiece is performed by the cutting blade with the workpiece held under suction on the chuck table.

SUMMARY OF THE INVENTION

With a cutting apparatus as described above, the workpiece may be damaged when held on the chuck table if foreign matter is stuck on the holding surface of the chuck table. It is therefore a current practice that before holding a workpiece on a chuck table, a holding surface is imaged by an imaging unit to inspect whether or not foreign matter exists on the holding surface (see, for example, JP 2000-216227A).

However, foreign matter may be small in size, and may hence be difficult to detect even by the imaging unit. Even if the workpiece is not damaged in this situation, the workpiece may be bulged at a part thereof by the foreign matter, and if subjected to cutting processing as it is, its processing quality may be reduced.

The present invention therefore has as objects thereof the provision of a cutting apparatus and a cutting method, which can efficiently detect foreign matter on a holding surface.

In accordance with a first aspect of the present invention, there is provided a cutting apparatus for cutting a chamfered outer peripheral portion of a workpiece. The cutting apparatus includes a chuck table having a holding surface that holds the workpiece, a processing unit that processes the workpiece held on the chuck table, a height measurement unit that measures heights of the workpiece held on the chuck table, and a controller that controls at least the chuck table, the processing unit, and the height measurement unit of the cutting apparatus. The controller includes a height distribution calculation section that calculates height distribution data of an outer periphery of the workpiece by measuring the heights of the workpiece at locations inside by a predetermined distance from an outer peripheral edge portion thereof with the height measurement unit while rotating the chuck table at least a full turn, a change rate calculation section that calculates height change rates as change rates of the heights of the outer periphery in the workpiece, based on the height distribution data calculated by the height distribution calculation section, a determination section that determines, based on results of comparison between the height change rates and a threshold, whether or not foreign matter exists on a back surface of the workpiece, and an error notification section that gives notification of an error if the foreign matter is determined to exist on the back surface of the workpiece.

In accordance with a second aspect of the present invention, there is provided a cutting method for cutting a chamfered outer peripheral portion of a workpiece. The cutting method includes a holding step of holding the workpiece by a chuck table having a holding surface, a height distribution calculation step of, after the holding step, calculating height distribution data of an outer periphery of the workpiece by measuring heights of the workpiece at locations inside by a predetermined distance from an outer peripheral edge portion thereof while rotating the chuck table at least a full turn, a change rate calculation step of calculating height change rates as change rates of the heights of the outer periphery in the workpiece, based on the height distribution data calculated in the height distribution calculation step, a determination step of determining, based on results of comparison between the height change rates and a threshold, whether or not foreign matter exists on a back surface of the workpiece, and a processing step of notifying an error if the foreign matter is determined to exist in the determination step or performing cutting of the chamfered outer peripheral portion if no foreign matter is determined to exist in the determination step.

In the present invention, the heights of the outer periphery of the workpiece are measured to calculate the height distribution data and then to calculate the change rates of the heights of the outer periphery of the workpiece. Based on the results of the comparison between the height change rates and the threshold, a determination is made as to whether or not foreign matter exists on the back surface of the workpiece, in other words, whether or not foreign matter exists on the holding surface of the chuck table. In the present invention, the sticking of foreign matter on the holding surface can hence be detected appropriately.

If foreign matter exists on the back surface of the workpiece, a notification is made accordingly in this invention. It is therefore possible to appropriately communicate, for example, to a worker that the foreign matter is stuck on the holding surface.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
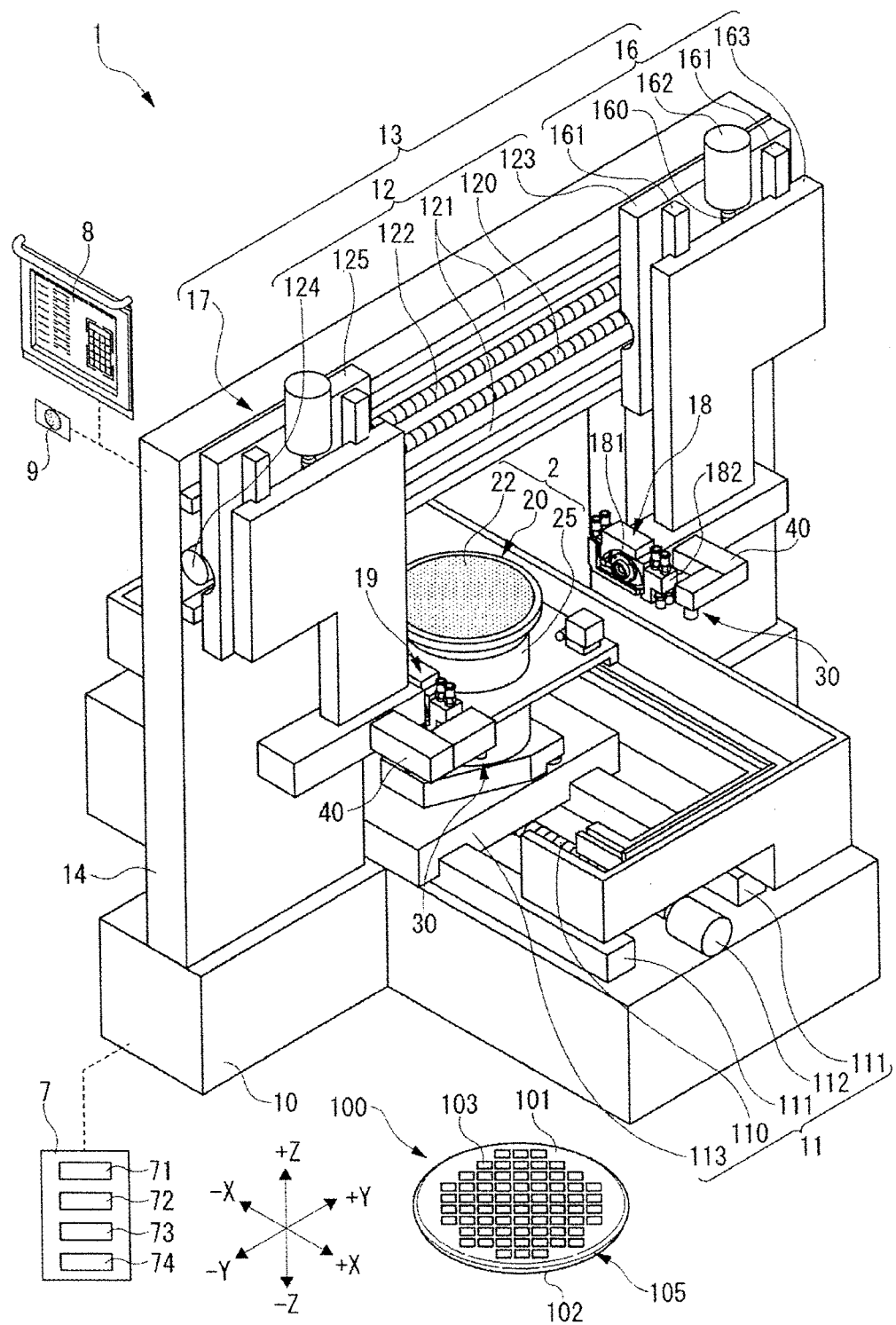
FIG. 1 is a perspective view depicting a configuration of a cutting apparatus according to an embodiment of a first aspect of the present invention.
Figure 2:
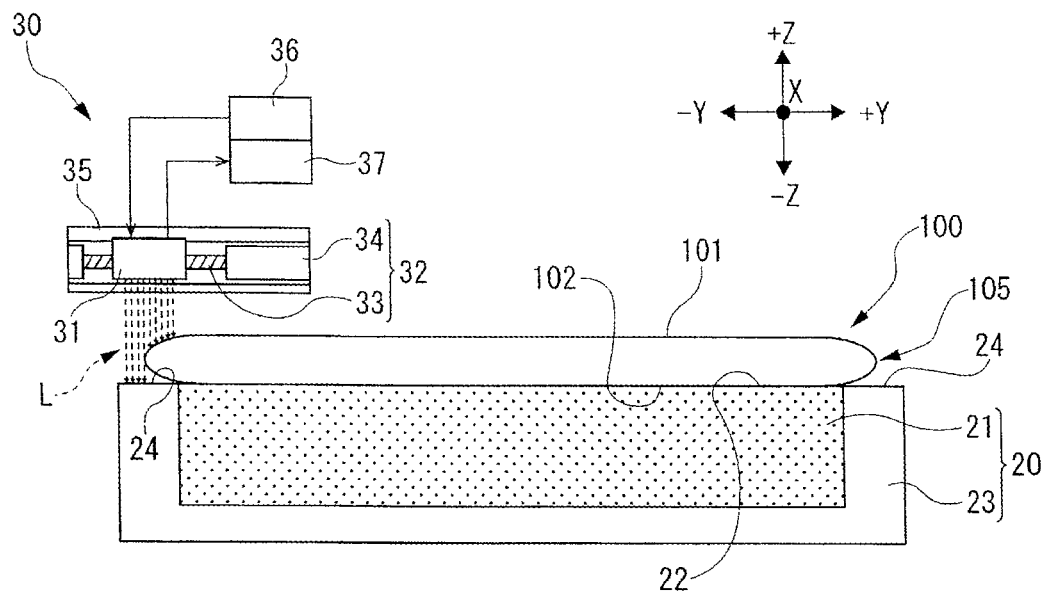
FIG. 2 is a cross-sectional view depicting configurations of a chuck table and one of two height measurement units in the cutting apparatus of FIG. 1.

With reference to FIGS. 1 and 2, a description will first be made about a cutting apparatus 1 according to an embodiment of the first aspect of the present invention. FIG. 1 is a perspective view depicting the configuration of the cutting apparatus 1, and FIG. 2 is a cross-sectional view depicting the configurations of a chuck table 20 and one of two height measurement units 30 in the cutting apparatus 1 of FIG. 1. A wafer 100 depicted in FIG. 1 is an example of a workpiece, and has a substantially circular shape as seen in plan. On a front surface 101 of the wafer 100, a plurality of devices 103 is formed. The wafer 100 has a back surface 102, which is a surface to be ground by grinding stones or the like.

As depicted in FIG. 2, the wafer 100 has been chamfered at an outer peripheral edge thereof, and a chamfered outer peripheral portion 105 having an arc-shaped cross-section is formed at the outer peripheral edge. The cutting apparatus 1 depicted in FIG. 1 is useful in cutting (performing edge-trimming of) the chamfered outer peripheral portion 105 of the wafer 100.

The cutting apparatus 1 is a generally-called dual dicing saw. The cutting apparatus 1 includes a bed 10, a gantry column 14 disposed upright on the bed 10, and a controller 7 that controls individual elements of the cutting apparatus 1.

On the bed 10, an X-axis direction moving mechanism 11 is arranged. The X-axis direction moving mechanism 11 moves the chuck table 20 in a cutting feed direction (X-axis direction). The X-axis direction moving mechanism 11 includes a pair of guide rails 111 extending in the X-axis direction, an X-axis table 113 mounted on the guide rails 111, a ball screw 110 extending in parallel to the guide rails 111, and a motor 112 that rotates the ball screw 110.

The paired guide rails 111 are arranged in parallel to the X-axis direction on an upper surface of the bed 10. On the paired guide rails 111, the X-axis table 113 is slidably arranged along the guide rails 111. On the X-axis table 113, a holding unit 2 is mounted with the chuck table 20 included therein.

The ball screw 110 is in threaded engagement with a nut portion (not depicted) disposed on the X-axis table 113. The motor 112 is connected to one end portion of the ball screw 110 to rotationally drive the ball screw 110. By the rotational drive of the ball screw 110, the X-axis table 113 and holding unit 2 are moved in the X-axis direction along the guide rails 111.

The holding unit 2 includes the chuck table 20 and a θ table 25. The chuck table 20 has a holding surface 22 that holds the wafer 100. The θ table 25 is a rotary shaft that rotates with the chuck table 20 supported thereon.

As depicted in FIG. 2, the chuck table 20 has a substantially disk-shaped frame body 23, and in a recessed portion disposed in the frame body 23, also has a holding member 21 made from a porous material such as porous ceramic. The holding member 21 has an upper surface, which serves as the holding surface 22 that holds the wafer 100 by suction. In the chuck table 20, the holding member 21 is brought into communication with a suction source (not depicted), whereby the wafer 100 can be held under suction on the holding surface 22.

As depicted in FIG. 1, the chuck table 20 is supported on the θ table 25 arranged on a side of a bottom surface of the chuck table 20. The θ table 25 is disposed rotatably in an X-Y plane on an upper surface of the X-axis table 113. Therefore, the θ table 25 supports the chuck table 20, and further can rotationally drive the chuck table 20 in the X-Y plane.

On a rear side (−X direction side) on the bed 10, the gantry column 14 is disposed upright so as to extend astride the X-axis direction moving mechanism 11.

On a front surface (a surface on a +X direction side) of the gantry column 14, a cutting unit moving mechanism 13 is arranged to move the first cutting unit 18 and a second cutting unit 19. The cutting unit moving mechanism 13 performs index feeding of the first cutting unit 18 and second cutting unit 19 in a Y-axis direction, and also their cutting-in feeding in a Z-axis direction.

The cutting unit moving mechanism 13 includes a first Z-axis direction moving mechanism 16, a second Z-axis direction moving mechanism 17, and a Y-axis direction moving mechanism 12. The first Z-axis direction moving mechanism 16 moves the first cutting unit 18, which is on a +Y direction side, in the Z-axis direction. The second Z-axis direction moving mechanism 17 moves the second cutting unit 19, which is on a −Y direction side, in the Z-axis direction. The Y-axis direction moving mechanism 12 moves the first cutting unit 18 and second cutting unit 19 in the Y-axis direction.

The Y-axis direction moving mechanism 12 is arranged on the front surface of the gantry column 14. The Y-axis direction moving mechanism 12 reciprocally moves the first Z-axis direction moving mechanism 16, including the first cutting unit 18, and the second Z-axis direction moving mechanism 17, including the second cutting unit 19, along the Y-axis direction.

The Y-axis direction moving mechanism 12 includes a pair of guide rails 121 extending in the Y-axis direction, a first Y-axis table 123 and a second Y-axis table 125 attached to the guide rails 121, a first ball screw 120 and second ball screw 122 extending in parallel to the guide rails 121, a first motor 124 that rotates the first ball screw 120, and a second motor (not depicted) that rotates the second ball screw 122.

In parallel to the Y-axis direction, the paired guide rails 121 are arranged on the front surface of the gantry column 14. On the paired guide rails 121, the first Y-axis table 123 and a second Y-axis table 125 are slidably arranged along these guide rails 121. On the first Y-axis table 123, the first Z-axis direction moving mechanism 16 and first cutting unit 18 are attached. On the second Y-axis table 125, the second Z-axis direction moving mechanism 17, and second cutting unit 19 are attached.

The first ball screw 120 is in threaded engagement with a nut portion (not depicted) disposed on the first Y-axis table 123. The first motor 124 is connected to one end portion of the first ball screw 120, and rotationally drives the first ball screw 120. By the rotational drive of the first ball screw 120, the first Y-axis table 123, first Z-axis direction moving mechanism 16, and first cutting unit 18 are moved in the Y-axis direction along the guide rails 121.

Similarly, the second ball screw 122 is in threaded engagement with a nut portion (not depicted) disposed on the second Y-axis table 125, and is rotationally driven by the second motor connected to one end portion of the second ball screw 122. As a consequence, the second Y-axis table 125, second Z-axis direction moving mechanism 17, and second cutting unit 19 are moved in the Y-axis direction along the guide rails 121.

The first Z-axis direction moving mechanism 16 reciprocally moves the first cutting unit 18 in the Z-axis direction. The first Z-axis direction moving mechanism 16 includes a pair of guide rails 161 extending in the Z-axis direction, a support member 163 arranged on the guide rails 161, a ball screw 160 extending in parallel to the guide rails 161, and a motor 162 that rotates the ball screw 160.

On the first Y-axis table 123, the paired guide rails 161 are arranged in parallel to the Z-axis direction. On the paired guide rails 161, the support member 163 is slidably arranged along these guide rails 161. On a lower end portion of the support member 163, the first cutting unit 18 is attached.

The ball screw 160 is in threaded engagement with a nut portion (not depicted) disposed on the support member 163. The motor 162 is connected to one end portion of the ball screw 160, and rotationally drives the ball screw 160. By the rotational drive of the ball screw 160, the support member 163 and first cutting unit 18 are moved in the Z-axis direction along the guide rails 161.

The second Z-axis direction moving mechanism 17 also reciprocally moves the second cutting unit 19 in the Z-axis direction. The second Z-axis direction moving mechanism 17 has a similar configuration as the first Z-axis moving mechanism 16, and its description is omitted accordingly.

The first cutting unit 18 and second cutting unit 19 are examples of processing units that process the wafer 100 held on the chuck table 20. The first cutting unit 18 serves to cut the wafer 100 held on the chuck table 20 and has a cutting blade 181 and an imaging unit 182. The imaging unit 182 images the wafer 100 held on the holding surface 22 of the chuck table 20, and detects the chamfered outer peripheral portion 105 as a location where the wafer 100 is to be cut. The cutting blade 181 is used to cut the chamfered outer peripheral portion 105 of the wafer 100.

Similarly to the first cutting unit 18, the second cutting unit 19 also serves to cut the wafer 100 held on the chuck table 20. The second cutting unit 19 has a similar configuration as the first cutting unit 18, and its description is omitted accordingly.

On the lower end portions of the support members 163 in the first Z-axis moving mechanism 16 and second Z-axis direction moving mechanism 17, the height measurement units 30 are attached via the support arms 40, respectively.

The height measurement units 30 are arranged such that they are located adjacent the first cutting unit 18 and second cutting unit 19. Along with the first cutting unit 18 and second cutting unit 19, the height measurement units 30 can be moved in the Y-axis direction and Z-axis direction by the cutting unit moving mechanism 13 that includes the Y-axis direction moving mechanism 12, first Z-axis direction moving mechanism 16, and second Z-axis direction moving mechanism 17.

Each height measurement unit 30 is configured to measure heights of the wafer 100 held on the chuck table 20. Described specifically, as depicted in FIG. 2, each height measurement unit 30 has, for example, an irradiation unit 31, a position adjustment unit 32, an oscillation unit 36, and a light-receiving unit 37. The irradiation unit 31 is arranged in a casing 35, and applies a laser beam L. The position adjustment unit 32 adjusts the position of the irradiation unit 31 along the Y-axis direction. The oscillation unit 36 controls the irradiation of the laser beam L from the irradiation unit 31. The light-receiving unit 37 receives reflection light of the laser beam L.

The position adjustment unit 32 includes a ball screw 33 extending in the Y-axis direction, and a motor 34 that rotates the ball screw 33. The ball screw 33 is in threaded engagement with a nut portion (not depicted) arranged on the irradiation unit 31. Through rotational drive of the ball screw 33 by the motor 34, the irradiation unit 31 is moved in the Y-axis direction.

Each height measurement unit 30 having the configuration described above applies the laser beam L from the irradiation unit 31 to a vicinity of the chamfered outer peripheral portion 105 of the wafer 100 held on the holding surface 22 of the chuck table 20, and also to a frame body surface 24 as an upper surface of the frame body 23. Based on reflection light of the laser beam L, the height measurement unit 30 can measure the height of the frame body surface 24 and the height of the vicinity of the chamfered outer peripheral portion 105 in the wafer 100, in other words, the height of the wafer 100 at a location inside by a predetermined distance from an outer peripheral edge portion (an outer peripheral edge of the chamfered outer peripheral portion 105) in the wafer 100.

As depicted in FIG. 1, the cutting apparatus 1 also includes a touch screen 8 attached to an undepicted casing. On the touch screen 8, a variety of kinds of information on the cutting apparatus 1 are displayed. The touch screen 8 is also used to set "various kinds of other information. As appreciated from the foregoing, the touch screen 8 functions as a display device for displaying information, and also functions as an input device for inputting information.

In a vicinity of the touch screen 8, a speaker 9 is also included to transmit information to a worker by voice.

The cutting apparatus 1 is also provided with the controller 7. The controller 7 includes a central processing unit (CPU) that performs processing according to a control program, and a recording medium such as a memory. The controller 7 performs a variety of processing and controls the individual elements of the cutting apparatus 1.

The controller 7 also includes a height distribution calculation section 71, a change rate calculation section 72, a determination section 7, and an error notification section 74, and uses these sections to perform cutting on the wafer 100 while detecting foreign matter on surfaces of the wafer 100.

A description will hereinafter be made about a cutting method according to an embodiment of the second aspect of the present invention, which is controlled by the controller 7. This cutting method is useful in cutting the chamfered outer peripheral portion 105 of the wafer 100. As will hereinafter be described in detail, the cutting method of this embodiment includes a holding step, a height distribution calculation step, a change rate calculation step, a determination step, and a processing step.

(1) Holding Step

In this step, the wafer 100 is held on the chuck table 20 having the holding surface 22. Described specifically, the worker or an undepicted transfer device places, in this step, the wafer 100 on the holding surface 22 of the chuck table 20 in the holding unit 2. The controller 7 then controls the undepicted suction source, so that a suction force is transmitted to the holding surface 22. As a consequence, the wafer 100 is held under suction on the holding surface 22.

(2) Height Distribution Calculation Step

Figure 3:
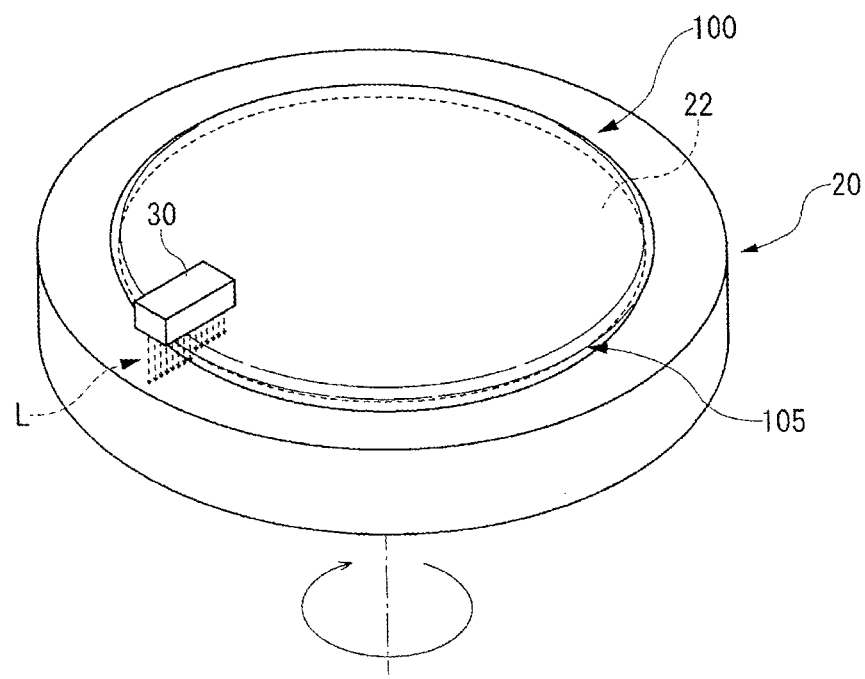
FIG. 3 is a perspective view depicting a height distribution calculation step in a cutting method according to an embodiment of the second aspect of the present invention.

With reference to FIG. 3, the height distribution calculation step will next be described. FIG. 3 is a perspective view depicting the height distribution calculation step. The controller 7 controls the X-axis direction moving mechanism 11, cutting unit moving mechanism 13, and θ table 25, and as depicted in FIG. 3, sets the position of the height measurement unit 30 such that the laser beam L from the height measurement unit 30 is applied to the chamfered outer peripheral portion 105 of the wafer 100 and a vicinity thereof.

While controlling the θ table 25 and rotating the chuck table 20 at least a full turn, the height distribution calculation section 71 of the controller 7 subsequently controls the height measurement unit 30, so that heights of the wafer 100 at locations inside by the predetermined distance from the outer peripheral edge portion of the wafer 100 are measured as heights of an outer periphery of the wafer 100 along the outer periphery of the wafer 100. Based on the heights measured as described above, the height distribution calculation section 71 calculates height distribution data of the outer periphery of the wafer 100. These pieces of height distribution data are those which indicate "the distribution of heights of the wafer 100 along the outer periphery of the wafer 100."

Figures 4A, 4B:
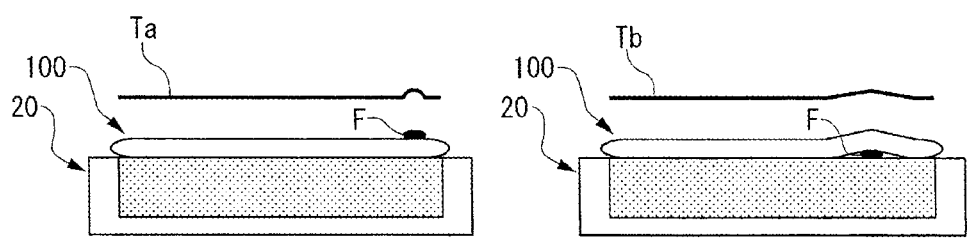
FIG. 4A is a cross-sectional view depicting foreign matter stuck on a part of a front surface of an outer periphery of a wafer.
FIG. 4B is a cross-sectional view depicting foreign matter stuck on a part of a back surface of the outer periphery of the wafer.
Figure 5:
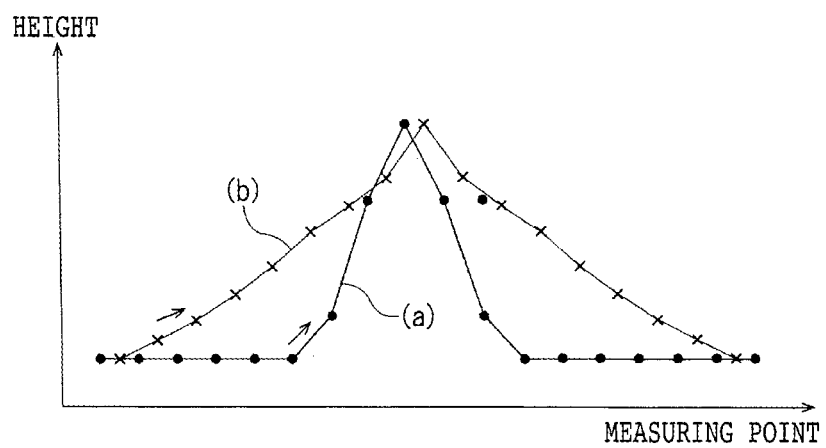
FIG. 5 is a graph illustrating two examples of height distribution data in the cases of FIGS. 4A and 4B that the foreign matter is stuck on the front surface and back surface of the wafers, respectively.

Now, a description will be made about two examples of a relation between foreign matter stuck on the wafer 100 and the height distribution data. FIG. 4A is a cross-sectional view depicting foreign matter F stuck on a part of the front surface 101 in the outer periphery of the wafer 100. In the case of FIG. 4A, heights Ta measured along the outer periphery of the wafer 100 are high at only the part where the foreign matter F is stuck. FIG. 5 is a graph illustrating two examples of height distribution data in the cases of FIGS. 4A and 4B that the foreign matter F is stuck on the front surface 101 of and back surface 102 of the wafer 100, respectively. In the case of FIG. 4A, the height distribution data calculated by the height distribution calculation section 71 hence also increases locally at only a measuring point, which corresponds to the foreign matter F, and its vicinity as illustrated by the graph (a) in FIG. 5.

Meanwhile, FIG. 4B is a cross-sectional view depicting foreign matter F stuck on a part of the back surface 102 in the outer periphery of the wafer 100, in other words, on the holding surface 22 of the chuck table 20. In the case of FIG. 4B, heights Tb measured along the outer periphery of the wafer 100 gradually increase toward the part where the foreign matter F is stuck. In the case of FIG. 4B, the height distribution data calculated by the height distribution calculation section 71 also gently increases toward a measuring point corresponding to the foreign matter F as illustrated by the graph (b) in FIG. 5.

(3) Change Rate Calculation Step

Based on the height distribution data calculated by the height distribution calculation section 71 in the height distribution calculation step, the change rate calculation section 72 of the controller 7 next calculates height change rates, that is, the change rates of the heights along the outer periphery in the wafer 100.

Here, the change rate calculation section 72 acquires, based on the height distribution data, the heights at the measuring points along the outer periphery of the wafer 100. The change rate calculation section 72 then finds each height change rate, for example, using the following equation (1):

$$\text{Height change rate} = ((\text{change amount of height between two measuring points})/(\text{distance between two measuring points})) \times 100\% \quad (1)$$

where the change amount of height between two measuring points means, for example, "the difference in measured height between the two measuring points," and the distance between two measuring points is, for example, "the distance between the two points along the outer periphery of the wafer 100."

Assume, for example, that four measuring points A to D are set side by side in this order on the outer periphery of the wafer 100. The locations of the measuring points A to D on the outer periphery of the wafer 100 are assumed to be $r_A$, $r_B$, $r_C$, and $r_D$, respectively, and the heights measured at the measuring points A to D are assumed to be $H_A$, $H_B$, $H_C$, and $H_D$, respectively.

In this case, using the height change amount $(H_B-H_A)$ between A and B, the height change amount $(H_C-H_B)$ between B to C, the height change amount $(H_D-H_C)$ between C to D, the distance $(r_B-r_A)$ between A and B, the distance $(r_C-r_B)$ between B to C, and the distance $(r_D-r_C)$ between C to D, the height change rate between A and B, the height change rate between B to C, and the height change rate between C to D are calculated, respectively, as follows:

$$\text{Height change rate between } A \text{ and } B=((H_B-H_A)/(r_B-r_A))\times 100\%$$

$$\text{Height change rate between } B \text{ to } C=((H_C-H_B)/(r_C-r_B))\times 100\%$$

$$\text{Height change rate between } C \text{ to } D=((H_D-H_C)/(r_D-r_C))\times 100\%$$

(4) Determination Step

Based on the results of comparison between the height change rates calculated by the change rate calculation section 72 and predetermined thresholds, the determination section 73 of the controller 7 next determines whether or not foreign matter exists on the back surface 102 of the wafer 100.

In this embodiment, two threshold values, one being a relatively small first threshold value and the other a relatively large second threshold value, are set for determination by the determination section 73. Using these two thresholds, the determination section 73 determines that no foreign matter is stuck on the wafer 100, foreign matter is stuck on the front surface 101 of the wafer 100, or foreign matter is stuck on the back surface 102 of the wafer 100.

Figure 6:
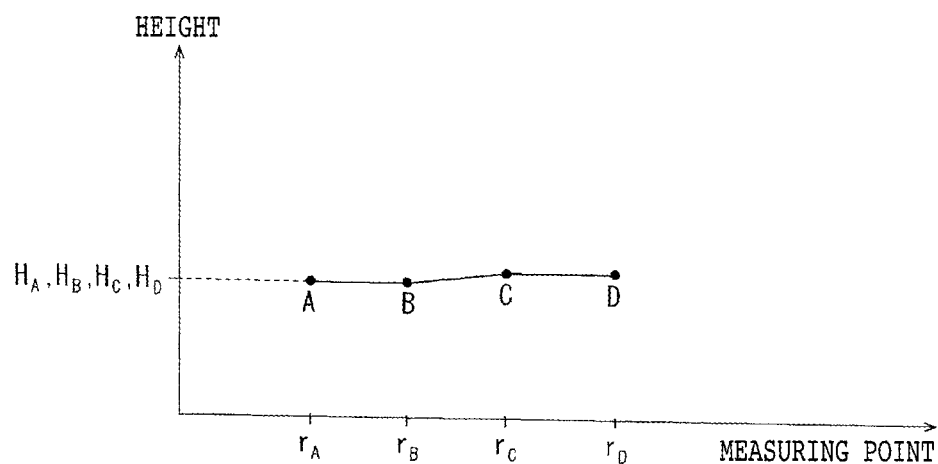
FIG. 6 is a graph illustrating an example of height distribution data in a case that no foreign matter is stuck on a wafer.

Examples of determination by the determination section 73 will hereinafter be described using the example of the above-mentioned four measuring points A to D. FIG. 6 is a graph illustrating an example of height distribution data in a case that no foreign matter is stuck on the wafer 100. As illustrated in FIG. 6, the heights $H_A$, $H_B$, $H_C$, and $H_D$ measured at the four measuring points A to D have substantially the same value. Therefore, the maximum value among the height change rate between A and B, the height change rate between B to C, and the height change rate between C to D is very small, that is, is smaller than the relatively small first threshold value. The determination section 73 hence determines that no foreign matter is stuck on the wafer 100 if the maximum value of height change rate as determined by the change rate calculation section 72 is smaller than the first threshold value.

Figure 7:
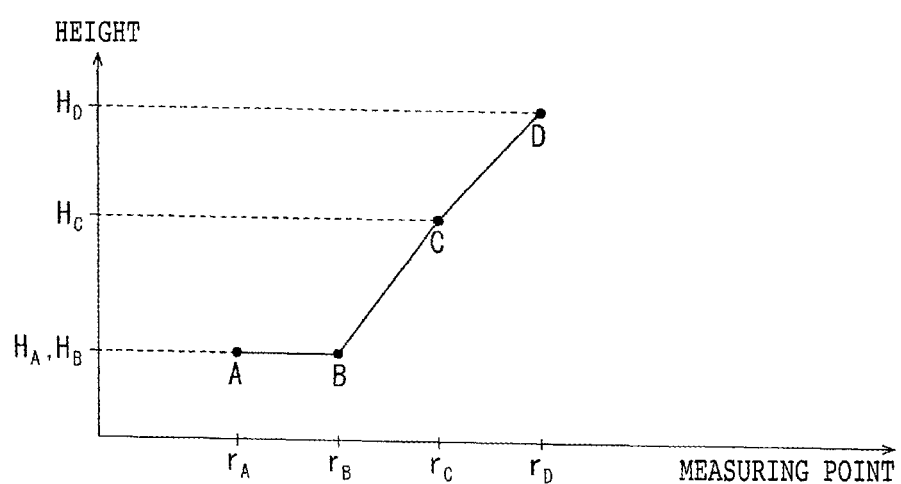
FIG. 7 is a graph illustrating an example of height distribution data in the case that the foreign matter is stuck on the front surface of the wafer.

Now assume that foreign matter is stuck in a vicinity of the measurement point D on the front surface 101 of the wafer 100. In this case, the height of the outer periphery of the wafer 100 locally increases near a location where foreign matter exists, as described using FIGS. 4A and 5. FIG. 7 is a graph illustrating examples of height distribution data in a case that foreign matter is stuck on the front surface 101 of the wafer 100. In this case, as illustrated in FIG. 7, the measured height of the outer periphery of the wafer 100 hence locally increases at the measuring point D and its adjacent measuring point C, but decreases at the measuring points A and B apart from the measuring point D. The maximum value among a height change rate between A and B, a height change rate between B to C, and a height change rate between C to D is therefore greater than the relatively large second threshold value. The determination section 73 thus determines that foreign matter is stuck on the front surface 101 of the wafer 100 if the maximum value among the height change rates as determined by the change rate calculation section 72 is greater than the second threshold value.

Figure 8:
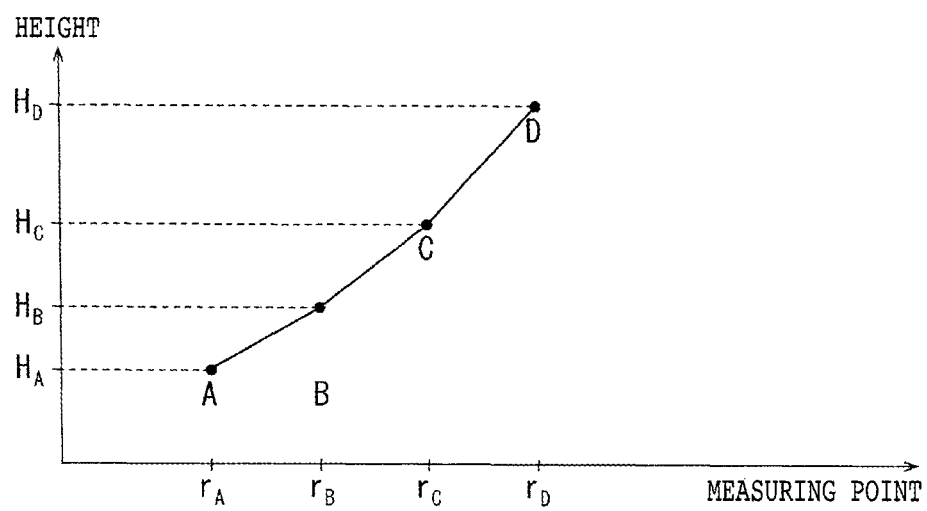
FIG. 8 is a graph illustrating an example of height distribution data in the case that the foreign matter is stuck on the back surface of the wafer.

Also assume that foreign matter is stuck in a vicinity of the measuring point D on the back surface 102 of the wafer 100. In this case, the height of the outer periphery of the wafer 100 gradually increases toward a part where foreign matter is stuck, as described using FIGS. 4B and 5. FIG. 8 is a graph illustrating examples of height distribution data in a case that foreign matter is stuck on the back surface 102 of the wafer 100. In this case, as illustrated in FIG. 8, the measured heights of the outer periphery of the wafer 100 change such that they gently increase toward the measuring point D. The maximum value among a height change rate between A and B, a height change rate between B to C, and a height change rate between C to D is therefore greater than the first threshold value, but smaller than the second threshold value. The determination section 73 thus determines that foreign matter exists on the back surface 102 of the wafer 100 (in other words, foreign matter exists on the holding surface 22 of the chuck table 20) if the maximum value among the height change rates as determined by the change rate calculation section 72 is greater than the first threshold value but smaller than the second threshold value.

(5) Processing Step

The error notification section 74 of the controller 7 next controls notification of an error based on the results of the determination by the determination section 73 in the determination step. If the determination section 73 determines that foreign matter exists on the back surface 102 of the wafer 100, for example, the error notification section 74 gives notification of an error to the worker. Described specifically, using the speaker 9 depicted in FIG. 1, the error notification section 74 gives notification of (communicates to) the worker by voice or sound (for example, an alarm sound) that foreign matter is stuck on the back surface 102 of the wafer 100, and at the same time, also gives notification of the worker of the same by characters or an image using the touch screen 8 depicted in FIG. 1. Then, the controller 7, for example, cancels the cutting operation on the wafer 100.

If the determination section 73 determines that no foreign matter is stuck on the wafer 100, on the other hand, the error notification section 74, for example, does not perform notification of an error. In this case, the controller 7 then controls the above-mentioned individual elements in the cutting apparatus 1 to perform cutting of the chamfered outer peripheral portion 105 of the wafer 100. Described specifically, with the chuck table 20 kept rotating by the θ table 25, the controller 7 controls the cutting blade 181 in the first cutting unit 18 or second cutting unit 19, so that the chamfered outer peripheral portion 105 of the wafer 100 is cut along a peripheral direction thereof.

Further, if the determination section 73 determines that foreign matter is stuck on the front surface 101 of the wafer 100, the error notification section 74 gives notification of the worker accordingly, for example, using the touch screen 8. Similar to the case that no foreign matter is stuck on the wafer 100, for example, the controller 7 then controls the individual elements of the cutting apparatus 1 to perform cutting of the chamfered outer peripheral portion 105 of the wafer 100.

In this embodiment, height change rates of the outer periphery of the wafer 100 are calculated by measuring heights of the outer periphery of the wafer 100 and calculating height distribution data as described above. Based on the results of comparison between the height change rates and threshold values, the determination is then made as to whether or not foreign matter exists on the back surface 102 of the wafer 100, in other words, whether or not foreign matter exists on the holding surface 22 of the chuck table 20. In this embodiment, it is therefore possible to appropriately detect that foreign matter is stuck on the holding surface 22.

If foreign matter exists on the back surface 102 of the wafer 100, the worker is also notified accordingly using a notification system including the touch screen 8 and speaker 9 in this embodiment. This embodiment can therefore appropriately communicate to the worker that the foreign matter is stuck on the holding surface 22. In this case, the controller 7 then cancels cutting operation in this embodiment. It is therefore possible to appropriately avoid performing cutting processing with foreign matter stuck on the holding surface 22.

Using the two threshold values consisting of the first threshold value and the second threshold value, the determination section 73 also determines in this embodiment that no foreign matter is stuck on the wafer 100, foreign matter is stuck on the front surface 101 of the wafer 100, or foreign matter is stuck on the back surface 102 of the wafer 100. In this embodiment, it is therefore possible to determine the location (the front surface 101 or the back surface 102) where foreign matter is stuck, in addition to the sticking of the foreign matter on the wafer 100.

It is to be noted that in this regard, the determination section 73 may be configured to determine with a single threshold value whether or not foreign matter is stuck on the back surface 102 of the wafer 100. In this case, the determination section 73 may be configured to determine that the foreign matter exists on the back surface 102 of the wafer 100 if the maximum value among height change rates calculated by the change rate calculation section 72 is greater than the threshold value, but to determine that no foreign matter exists on the back surface 102 of the wafer 100 if the maximum value among the height change rates is equal to or smaller than the threshold value.

The change rate calculation section 72 may also be configured such that in the change rate calculation step, data (a measuring point and a measured height) that are locally high are extracted from the height distribution data, and thickness change rates are then calculated using the extracted data and their preceding and trailing data. With this configuration, thickness change rates can be calculated, paying attention to a part where foreign matter is considered to be stuck on the wafer 100. It is hence possible to efficiently calculate the thickness change rates that are useful in determining the sticking of foreign matter on the wafer 100.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A cutting apparatus for cutting a chamfered outer peripheral portion of a workpiece, comprising:
   a chuck table having a holding surface that holds the workpiece;
   a processing unit that processes the workpiece held on the chuck table;
   a height measurement unit that measures heights of the workpiece held on the chuck table; and
   a controller that controls at least the chuck table, the processing unit, and the height measurement unit of the cutting apparatus, wherein
   the controller includes:
      a height distribution calculation section that calculates height distribution data of an outer periphery of the workpiece by measuring the heights of the workpiece at locations inside by a predetermined distance from an outer peripheral edge portion thereof with the height measurement unit while rotating the chuck table at least a full turn,
      a change rate calculation section that calculates height change rates as change rates of the heights of the outer periphery in the workpiece, based on the height distribution data calculated by the height distribution calculation section,
      a determination section that determines, based on results of comparison between the height change rates and a threshold, whether or not foreign matter exists on a back surface of the workpiece, and
      an error notification section that gives notification of an error if the foreign matter is determined to exist on the back surface of the workpiece.

2. A cutting method for cutting a chamfered outer peripheral portion of a workpiece, the method comprising:
   a holding step of holding the workpiece by a chuck table having a holding surface;
   a height distribution calculation step of, after the holding step, calculating height distribution data of an outer periphery of the workpiece by measuring heights of the workpiece at locations inside by a predetermined distance from an outer peripheral edge portion thereof while rotating the chuck table at least a full turn;
   a change rate calculation step of calculating height change rates as change rates of the heights of the outer periphery in the workpiece, based on the height distribution data calculated in the height distribution calculation step;
   a determination step of determining, based on results of comparison between the height change rates and a threshold, whether or not foreign matter exists on a back surface of the workpiece, and
   a processing step of notifying an error if the foreign matter is determined to exist in the determination step or performing cutting of the chamfered outer peripheral portion if no foreign matter is determined to exist in the determination step.

* * * * *